United States Patent [19]

Sell

[11] Patent Number: 5,084,698
[45] Date of Patent: * Jan. 28, 1992

[54] ILLUMINATED POINTER INSTRUMENT

[75] Inventor: Gerhard Sell, Schwalbach/Ts, Fed. Rep. of Germany

[73] Assignee: VDO Adolf Schindling AG, Frankfurt am Main, Fed. Rep. of Germany

[*] Notice: The portion of the term of this patent subsequent to Sep. 10, 2008 has been disclaimed.

[21] Appl. No.: 448,062

[22] Filed: Dec. 8, 1989

[30] Foreign Application Priority Data

Feb. 16, 1989 [DE] Fed. Rep. of Germany ....... 3904656

[51] Int. Cl.$^5$ .............................................. G09G 3/14
[52] U.S. Cl. .................................. 340/701; 340/762; 340/782; 116/288; 362/29
[58] Field of Search .................. 116/288; 340/815.01, 340/815.03, 815.1, 704, 701, 762, 782; 362/29, 26, 28, 30, 32; 350/97

[56] References Cited

U.S. PATENT DOCUMENTS

| | | | |
|---|---|---|---|
| 2,189,535 | 2/1940 | Stuerzl | 362/28 |
| 3,267,598 | 8/1966 | Olesen et al. | 340/815.1 |
| 3,641,967 | 2/1972 | Charbonneaux | 116/288 |
| 3,740,570 | 6/1973 | Kaelin et al. | 340/793 X |
| 3,873,979 | 3/1975 | Craford et al. | 340/815.03 |
| 3,918,053 | 11/1975 | Towne et al. | 340/815.03 |
| 4,044,708 | 8/1977 | Klein | 362/29 X |
| 4,086,514 | 4/1978 | Havel | 313/500 |
| 4,163,428 | 8/1979 | Ishikawa | 362/29 X |
| 4,252,078 | 2/1981 | Fukasawa et al. | 116/288 |
| 4,257,084 | 3/1981 | Reynolds | 362/31 |
| 4,845,481 | 7/1989 | Havel | 340/815.1 X |
| 4,851,824 | 7/1989 | Murata | 340/762 X |
| 4,882,659 | 11/1989 | Gloudemans | 362/30 |

FOREIGN PATENT DOCUMENTS

| | | |
|---|---|---|
| 0078372 | 5/1983 | European Pat. Off. . |
| 3139004 | 5/1982 | Fed. Rep. of Germany . |
| 3331724 | 3/1985 | Fed. Rep. of Germany . |

*Primary Examiner*—Daniel M. Yasich
*Attorney, Agent, or Firm*—Martin A. Farber

[57] ABSTRACT

In an indicator instrument, at least one light-emitting diode (8, 9) which lights up in different colors depending on the manner in which it is controlled is provided in a light guide (5). In this way, the pointer instrument can be illuminated in simple fashion in different colors, for instance as a function of the position of the pointer.

6 Claims, 1 Drawing Sheet

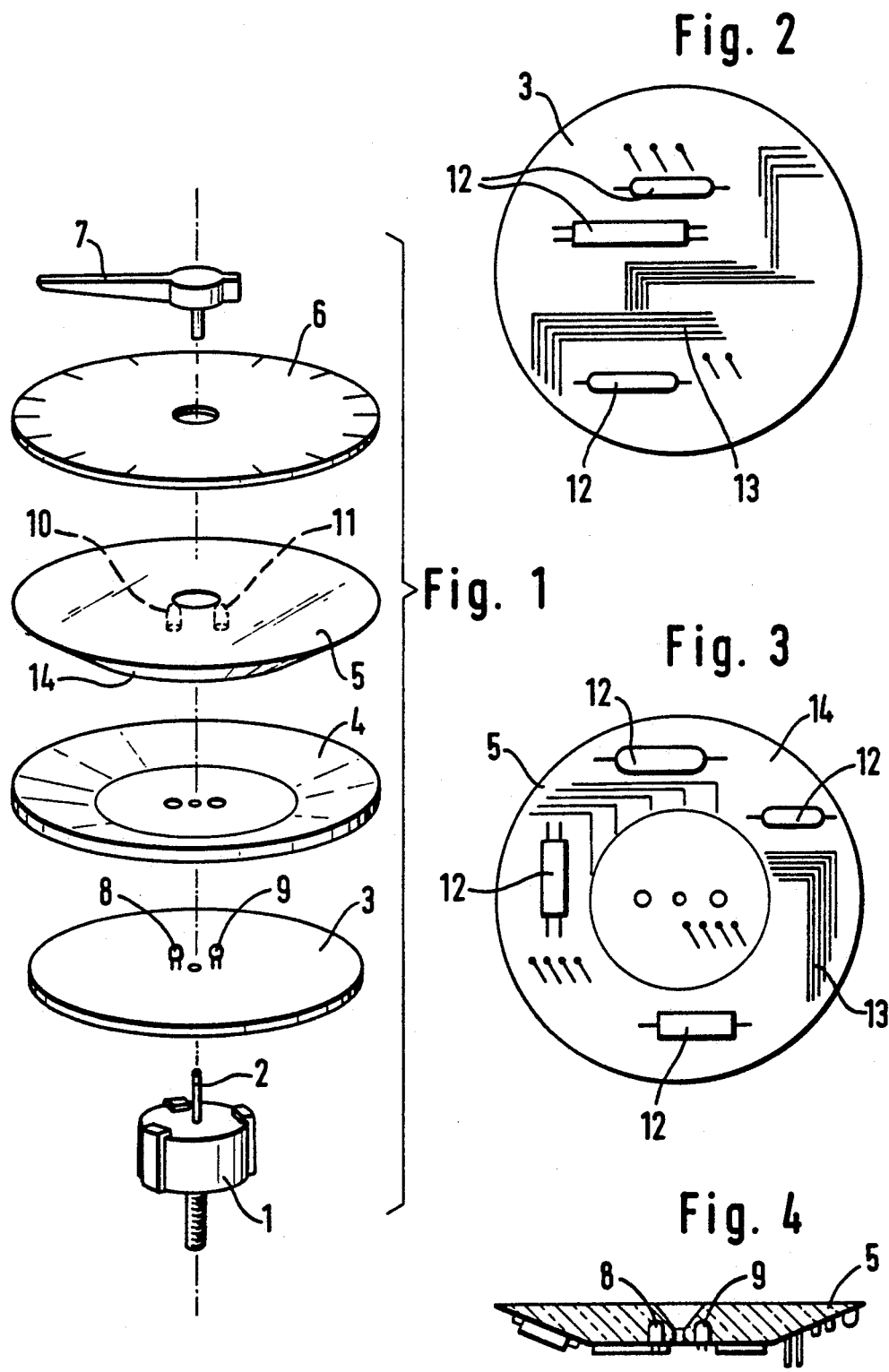

5,084,698

ILLUMINATED POINTER INSTRUMENT

FIELD AND BACKGROUND OF THE INVENTION

The present invention relates to a pointer instrument having a light guide illuminated by a light-emitting diode.

Such pointer instruments are customary in modern motor vehicles and therefore are generally known.

It is frequently desirable for the color of the illumination in pointer instruments to be changed as a function of the position of the pointer. For example, in the case of a fuel-level display, one can have the illumination change from white to red when the level drops below a reserve quantity so as to call the attention of the driver of a motor vehicle to this condition. In order to make such a change in color possible, at least two sources of differently colored light are provided in the prior-art indicating instruments. As a result the instrument becomes relatively expensive. Another disadvantage of the two sources of light is that together they require a considerable amount of space, which is frequently not available in indicating instruments.

SUMMARY OF THE INVENTION

It is an object of the invention so to develop a pointer instrument of the above-mentioned type wherein the instrument can be illuminated in different colors in the simplest way possible.

According to the invention, this object is obtained in a surprisingly simple manner by employing a light-emitting diode (e.g. 8, 9) which lights up in different colors depending on how it is controlled.

By this development of the pointer instrument, a single light-emitting diode suffices to provide illumination in different colors, depending on the position of the pointer or on other factors. In this way, the pointer instrument of the invention is of very simple construction and is of low height, so that it is particularly well suitable for installation in a motor vehicle.

The invention can be realized with customary technology if the light-emitting diode (8, 9) is fastened to a circuit board (3) arranged below the light guide (5) and extends through an opening (10, 11) in the light guide (5).

The pointer instrument is developed particularly compactly if the light-emitting diode (8, 9) is fastened to the back side of the light guide (5) and extends into an opening (10, 11) in the light guide (5), and if the electronic components (12) for driving the diode are also provided on the back side of the light guide (5), as shown in FIG. 3. Such an embodiment can furthermore be manufactured particularly inexpensively since the light guide has a two fold function and forms, at the same time, the support for the electronic components.

The space available in the housing of the pointer instrument is optionally utilized if the electronic components (12) are arranged on a conical surface (14) of the light guide (5), the conical surface serving as deflecting surface.

A large number of different colors can be obtained if a total of two light-emitting diodes (8, 9) are provided in the light guide (5). These light-emitting diodes can be switched in such a manner that only one of them lights up in all cases in a given color. However, it is also possible to switch them in such a manner that they light up at the same time in a different color so that a mixed color results for the instrument illumination.

A particularly effective instrument illumination can be obtained with a relatively weak source of light if, in accordance with another embodiment of the invention, a reflector (4) is arranged between the light guide (5) and the printed circuit board (3).

DETAILED DESCRIPTION OF THE DRAWING

With the above and other objects and advantages in view, the present invention will become more clearly understood in connection with the detailed description of preferred embodiments, when considered with the accompanying drawing, of which:

FIG. 1 shows an exploded view, without the instrument housing, of a pointer instrument developed in accordance with the invention;

FIG. 2 is a bottom view of a printed circuit board of the indicating instrument;

FIG. 3 is a bottom view of a light guide of different form used in the second embodiment of the invention; and FIG. 4 is a horizontal section through the light guide of FIG. 3.

DETAILED DESCRIPTION OF THE PREFERRED EMBODIMENTS

FIG. 1 shows a measurement movement 1, consisting, for instance or a rotary-magnet ratio measuring mechanism. The measuring movement 1 has a measurement-movement shaft 2 which, in the assembled condition of the pointer instrument, passes through a printed circuit board 3, a reflector 4, a light guide 5 and a dial 6, so that a pointer 7 can be mounted on it.

On the printed circuit board 3 there are arranged two upward pointing light-emitting diodes 8, 9 which are so developed that they light up in a different color depending on how they have been controlled. By way of example, a diode emitting light, wherein the color and intensity are controllable by current magnitude and duty cycle, is disclosed in U.S. Pat. No. 3,740,570 of Kaelin et al. In the assembled condition of the pointer instrument these light-emitting diodes 8, 9 extend through the reflector 4 into openings 10 and 11, respectively, in the light guide 5 so that they are capable of illuminating the latter.

FIG. 2 shows the printed circuit board 3 from below so that the electronic components 12 and conductive paths 13 arranged on it can be noted. The components 12 provide current to the diodes 8, 9 to control color and intensity of the light emitted by the diodes 8, 9 in accordance with teachings of the aforementioned patent of Kaelin et al.

In an alternative embodiment, shown in FIGS. 3 and 4, the electronic components 12 and the conductive paths 13 are arranged on the rear of the light guide 5 rather than on a printed circuit board 3. For this purpose, the conical surface 14 of the light guide 5, which has the shape of a conical disk and serves as deflection surface, is preferably used.

From FIG. 4 it can be seen that the light-emitting diodes 8, 9 can also be fastened in the light guide 5 rather than on the printed circuit board 3. The light-emitting diodes 8, 9 are in their turn so developed that they light up in different colors depending on the manner in which they are controlled. If a light guide having electronic components in accordance with FIGS. 3 and 4 is used, then of course no printed circuit board 3 is required in the pointer instrument.

I claim:

1. A pointer instrument comprising
at least one light-emitting diode capable of radiating light in a plurality of colors;
a light guide illuminated by said at least one light-emitting diode; and
a circuit board located behind the light guide for applying electric current to said at least one diode, the current energizing said at least one diode to emit light, the light guide having an opening;
a reflector disposed between the light guide and the circuit board;
wherein a color of the light of said at least one light-emitting diode is controllable by variation of a magnitude of said current; and
said at least one light-emitting diode is fastened to the circuit board and extends through the reflector and through the opening in the light guide.

2. An instrument according to claim 1, wherein the light guide has a conical surface which serves as a light deflecting surface.

3. A pointer instrument comprising
a first light-emitting diode capable of radiating light in a plurality of colors;
a light guide illuminated by the light-emitting diode;
a circuit board located behind the light guide for applying electric current to said at least one diode, the current energizing said at least one diode to emit light, the light guide having an opening;
a reflector disposed between the light guide and the circuit board;
wherein the color of the light of the first light-emitting diode is controllable by variation of a magnitude of said current;
the light-emitting diode is fastened to the circuit board and extends into an opening in the light guide; and
the instrument further comprises electronic components secured to the back side of the circuit board; and
a second light emitting diode located on the circuit board and extending through an opening in the light guide.

4. A pointer instrument comprising:
at least one light-emitting diode capable of radiating light in a plurality of colors;
a light guide and a conical reflecting surface for directing said light, the guide having an aperture for receiving said at least one diode;
a circuit board located behind the light guide, said diode connecting with the circuit board and extending through the aperture for radiating light toward the reflecting surface, a back side of a conical portion of said guide facing said board, the circuit board applying electric current to said at least one diode for energizing said at least one diode to emit light; and
wherein a color of the light of said at least one light-emitting diode can be varied by variation of a magnitude of said current.

5. An instrument according to claim 4, wherein said diode is secured to said board.

6. An instrument according to claim 4, further comprising
a reflector having said reflecting surface and being positioned about said diode and being located between said guide and said board.

* * * * *